(12) United States Patent
Lee et al.

(10) Patent No.: US 9,583,700 B2
(45) Date of Patent: Feb. 28, 2017

(54) RRAM PROCESS WITH ROUGHNESS TUNING TECHNOLOGY

(71) Applicant: MACRONIX INTERNATIONAL CO., LTD., Hsinchu (TW)

(72) Inventors: Feng-Min Lee, Hsinchu (TW); Yu-Yu Lin, Hsinchu (TW); Dai-Ying Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/746,703

(22) Filed: Jun. 22, 2015

(65) Prior Publication Data
US 2016/0218146 A1 Jul. 28, 2016

Related U.S. Application Data

(60) Provisional application No. 62/106,743, filed on Jan. 23, 2015.

(51) Int. Cl.
*H01L 45/00* (2006.01)

(52) U.S. Cl.
CPC .......... *H01L 45/1253* (2013.01); *H01L 45/04* (2013.01); *H01L 45/1233* (2013.01); *H01L 45/146* (2013.01); *H01L 45/1633* (2013.01)

(58) Field of Classification Search
CPC ................................. H01L 45/1608
See application file for complete search history.

(56) References Cited

U.S. PATENT DOCUMENTS

| | | | |
|---|---|---|---|
| 7,943,920 B2 | 5/2011 | Chien et al. | |
| 7,978,496 B2 | 7/2011 | Kumar et al. | |
| 8,279,656 B2 | 10/2012 | Chien et al. | |
| 8,525,290 B2 | 9/2013 | Lai et al. | |
| 2005/0247921 A1 | 11/2005 | Lee et al. | |
| 2008/0237693 A1 | 10/2008 | Lee et al. | |
| 2010/0308298 A1 | 12/2010 | Ninomiya et al. | |

(Continued)

FOREIGN PATENT DOCUMENTS

| | | |
|---|---|---|
| TW | 200832680 A | 8/2008 |
| TW | 200849566 A | 12/2008 |

(Continued)

OTHER PUBLICATIONS

Baek I.G., "Highly Scalable Non-volatile Resistive Memory using Simple Binary Oxide Driven by Asymmetric Unipolar Voltage Pulses," IEEE IEDM Dec. 13-15, 2004, 4 pages.

(Continued)

*Primary Examiner* — Tran Tran
(74) *Attorney, Agent, or Firm* — Haynes Beffel & Wolfeld LLP

(57) ABSTRACT

The present invention relates to metal oxide based memory devices and methods for manufacturing such devices; and more particularly to memory devices having data storage materials based on metal oxide compounds fabricated with a roughness tuning process including an ion bombardment step of a bottom electrode surface prior to formation of a memory element on the bottom electrode surface. Ion bombardment improves the flatness of the bottom electrode which is beneficial in achieving a more uniform electrical field during operation, which improves device reliability.

14 Claims, 8 Drawing Sheets

(56) References Cited

U.S. PATENT DOCUMENTS

2011/0002155 A1  1/2011 Arita et al.
2011/0140069 A1  6/2011 Inoue
2012/0223284 A1* 9/2012 Tamai ................ H01L 45/08
                                                    257/4

FOREIGN PATENT DOCUMENTS

TW    201203456 A    1/2012
TW    201301450 A    1/2013

OTHER PUBLICATIONS

Chen, AN, et al., "Non-Volatile Resistive Switching for Advanced Memory Applications," IEEE IEDM, Dec. 5-7, 2005, 4 pages.
Kozicki, Michael N., et al., "A Low-Power Nonvolatile Switching Element Based on Copper-Tungsten Oxide Solid Electrolyte," IEEE Trans. on Nanotechnology, V. 5, No. 5, Sep. 2006, 10 pages.
U.S. Appl. No. 14/750,801, filed Jun. 25, 2015 entitled "Capped Contact Structure With Variable Adhesion Layer Thickness," Inventors Yu-Yu Lin, et al., 27 pages.

\* cited by examiner

RRAM PROCESS WITH ROUGHNESS TUNING TECHNOLOGY

RELATED APPLICATIONS

This application claims the benefit of U.S. Provisional Patent Application No. 62/106,743 filed on 23 Jan. 2015, which application is incorporated by reference as if fully set forth herein.

BACKGROUND OF THE INVENTION

Field of the Invention

The present invention relates to metal oxide based memory devices and methods for manufacturing such devices; and more particularly to memory devices having data storage materials based on metal oxide compounds fabricated with a roughness tuning process including an ion bombardment step of a bottom electrode surface prior to formation of a memory element on the bottom electrode surface. Ion bombardment improves the flatness and decreases the surface roughness of the bottom electrode which is beneficial in achieving a more uniform electrical field during operation, which improves device reliability.

Description of Related Art

Resistive random access memory, RRAM or ReRAM, is a type of nonvolatile memory that provides the benefits of small cell size, scalability, ultrafast operation, low-power operation, high endurance, good retention, large On/Off ratio, and CMOS compatibility. One type of RRAM includes a metal oxide layer than can be caused to change resistance between two or more stable resistance ranges by application of electrical pulses at levels suitable for implementation in integrated circuits, and the resistance can be read and written with random access to indicate stored data.

RRAM memory may include a metal oxide memory element in a current path between first and second electrodes. The electrodes may be terminals to access devices and/or may be coupled to access lines such as bit, word, and source lines. The access lines are connected to circuitry to perform operations, such as SET and RESET operations, which may operate to change the state of the memory element in order to store data.

In prior methods of forming a memory element of an RRAM memory cell, a metal plug, such as a tungsten plug, is deposited using chemical vapor deposition (CVD). A chemical mechanical planarization (CMP) process is performed on the plug. The CMP process is followed by an oxidation process such as rapid thermal oxidation. This oxidation process creates a layer of metal oxide that is the memory element of the RRAM memory cell. The resulting memory cell may have a rough interface between the bottom electrode surface of the tungsten plug formed by the CMP process and the metal oxide memory element. In addition to this rough interface, the rough bottom electrode surface may cause the top surface of the memory element to be rough as well. This roughness of the memory element will cause a rough interface between the memory element and a top electrode deposited on the memory element. These rough interfaces between the electrodes and the memory element lead to a non-uniform oxide profile that may cause severe leakage current, leading to poor switching behavior and poor uniformity, which effect device reliability. Further, the rough interfaces may cause a wide distribution of resistances from cell to cell.

It is therefore desirable to provide a memory cell and method of manufacture that provides interfaces between the memory element and the top and bottom electrodes that have low surface roughness.

SUMMARY

Memory devices based on metal oxide memory elements, for example tungsten-oxide, are described along with methods for manufacturing.

An example of a memory device comprises top and bottom electrodes with a memory element located between and electrically coupled to the top and bottom electrodes. In an example embodiment, the memory device comprises a flattened electrode surface surrounded by an indentation in the surrounding insulation material comprising rounded concave sidewall portions, wherein the bottom electrode surface and the base of the indentation are recessed below the top surface of the insulation material.

An example of a method of fabricating a memory device is carried out as follows. A bottom element in the form of an interlayer conductor, such as a tungsten plug, is deposited using CVD in a via formed in an insulating layer. A CMP process is performed on the top surfaces of the insulation layer and interlayer conductor resulting in the top surface of the interlayer conductor being recessed below the top surface of the insulating layer. The resulting top surface of the interlayer conductor after the CMP process may be rough due to grain growth in the previous CVD process. A rough electrode surface is not desirable for forming a memory element on. The CVD process further results in the corner of the insulating layer at the via being rounded and the walls of the via forming a sharp corner where the insulating material meets the recessed interlayer conductor. This CMP process is followed by an ion bombardment process performed on the top surface of the insulating layer and the interlayer conductor. The ion bombardment process results in a flattened electrode surface of the tungsten plug suitable for forming a metal oxide memory element on. The ion bombardment process further results in removal of insulating layer material around the interlayer conductor forming an indentation in the insulating layer. The indentation includes a flattened bottom portion that is recessed substantially the same depth below the top surface of the insulating layers as the flattened electrode surface of the interlayer conductor. The indentation further includes concave sidewall portions extending from the flattened bottom portion of the indentation. This step is followed by forming a memory element on the flattened electrode surface of the interlayer conductor. For example, a rapid thermal oxidation may be used to create a metal oxide layer from the metal of the interlayer conductor, in this example tungsten oxide (WOx). Due to the memory element being formed on a flattened surface, the top surface of the memory element may also have a lower surface roughness than if an ion bombardment process were not performed on the interlayer conductor. After formation of the memory element a top electrode material is deposited on the memory element. The method of fabricating a memory device may further include forming circuitry for performing read operations, and write operations (such as SET and RESET operations).

The structure and methods of the present invention are disclosed in the detailed description below. Other aspects and advantages of the present invention can be seen on review of the drawings, the detailed description and the claims, which follow.

BRIEF DESCRIPTION OF THE DRAWINGS

The invention will be described with respect to the specific embodiments thereof, and reference will be made to the drawings, in which.

DETAILED DESCRIPTION

Figure 1A:
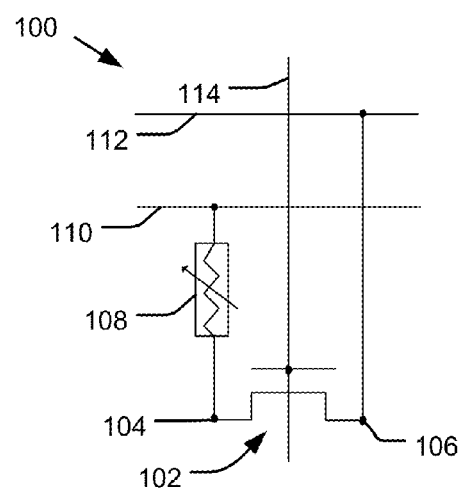
FIG. 1A is a schematic of a memory cell in accordance with an embodiment.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1A illustrates a schematic of a memory cell 100 in accordance with an embodiment. The memory cell 100 includes an access device in the form of a transistor 102 with a first terminal 104 and a second terminal 106. The memory cell further includes a memory element 108 located between the first terminal 104 and a first access line 110, in the example a bit line, and a second access line 112, in the example a source line, connected to the second terminal 106. In the embodiment shown with the access device being transistor 102, the memory device further includes a third access line 114, in the example a word line, connected to the gate of the transistor 102. Alternatively, in embodiments, the access device may be a diode, such as is shown in the cross-point array of memory cells 100 in FIG. 1B and, in such embodiments, a third access line is not included.

Figure 2:
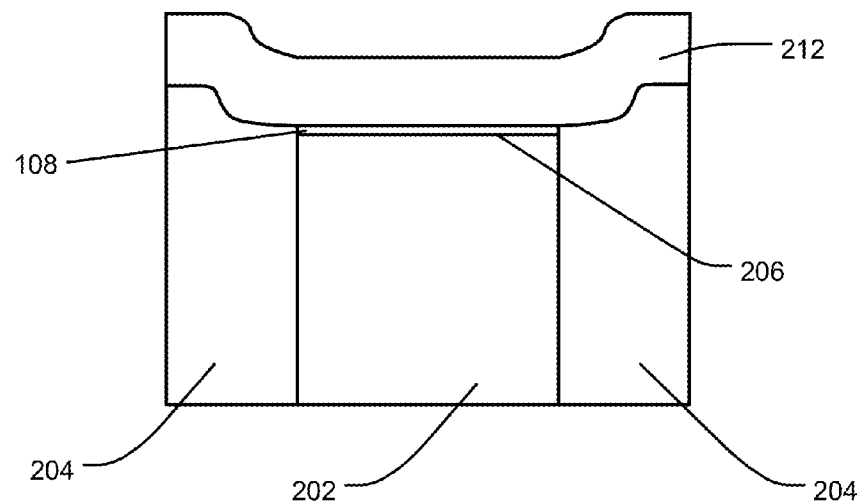
FIG. 2 is a simplified cross-sectional view of a first example of a variable resistance memory element.

FIG. 2 is a simplified cross-sectional view of a first example of a variable resistance memory element 108. An interlayer conductor 202 extends through an insulating dielectric layer 204, for example a silicon dioxide layer. The interlayer conductor 202 on one end may be coupled to an access device, such as a drain terminal of an access transistor or a terminal of a diode; or an access line. In the embodiment discussed, the interlayer conductor 202 is a tungsten plug. However, in embodiments, the material of the interlayer conductor could be other metals such as Ti, Ta, Al, TiN, TaN, Cu and Hf. Further, in embodiments, the interlayer conductor is surrounded by a liner layer, such as a TiN liner.

The memory element 108 is located on the flattened top electrode surface 206 of the interlayer conductor 202. The top electrode surface is flattened during a roughness tuning process, including an ion bombardment step, described below. The top electrode surface of the interlayer conductor 202 is located in a recess in the top surface of the insulating dielectric layer 204. The indentation in the insulating dielectric layer 204 is formed by the ion bombardment process, wherein portions of the insulating dielectric layer 204 are removed to form the rounded recess wherein a bottom portion of the and the top surface of the interlayer conductor 202 are recessed below the top surface of the insulating dielectric layer 204 to substantially the same depth. In the embodiment shown, the memory element 108 is programmable to at least two resistance states. The memory element 108 may be comprised of one or more tungsten-oxygen compounds (WOx), for example one or more of $WO_3$, $W_2O_5$, $WO_2$. On top of the memory element 108 is a top electrode 212, in this embodiment an access line. As shown in FIG. 2, the top electrode 212 is formed within the indentation in the insulating dielectric layer 204.

A memory cell, specifically the top electrode surface and surrounding top surface and indentation of the insulating dielectric layer, can be formed by the manufacturing steps illustrated in FIGS. 3A-3D. The illustrations of the processes highlight the memory element component of the memory cell and omit an access device and components of the memory cell that are specific to particular access devices and access line and array configurations.

Figure 3A:
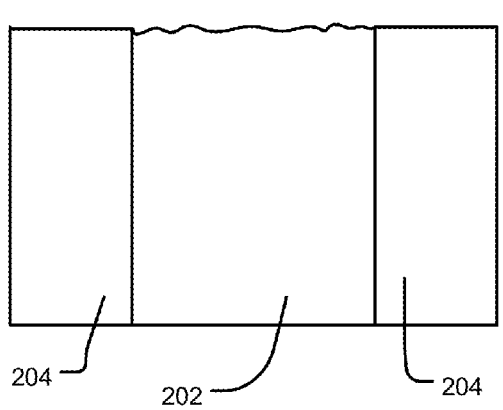
FIGS. 3A, 3B, 3C, 3D are schematic illustrations of the steps of manufacture of a memory cell in accordance with an embodiment.
Figure 6:
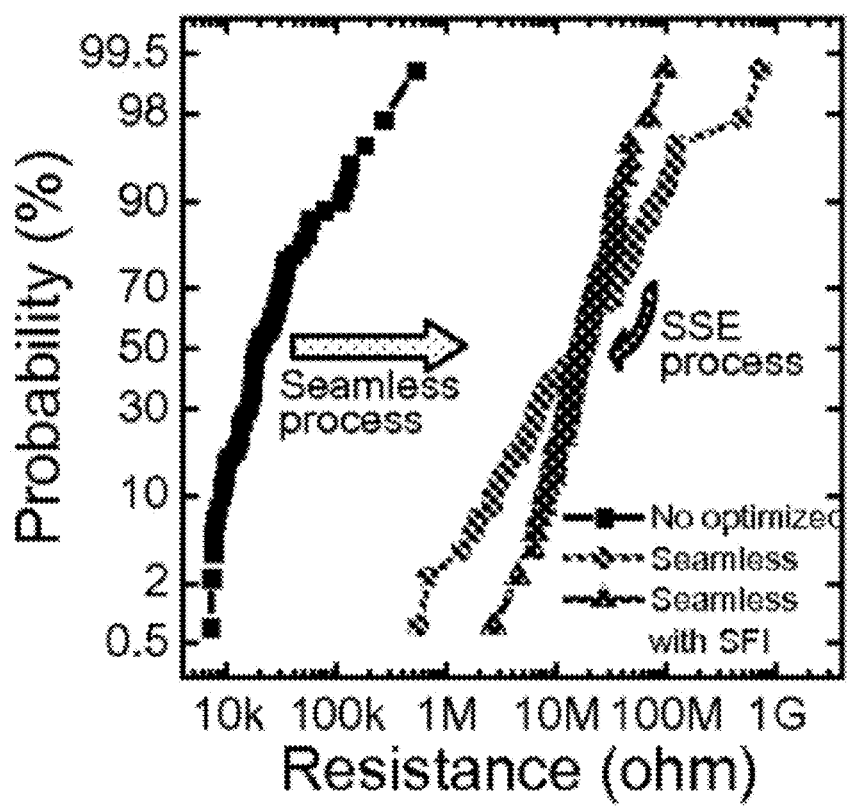
FIG. 6 is a graph showing comparison of initial resistance distributions of memory devices with different methods of manufacture.

As shown in FIG. 3A, interlayer conductors 202 are formed through vias in the dielectric insulator layer 204 so that the bottom end of the interlayer conductor 202 contacts an access line or terminal of an access device. In the embodiment shown, the interlayer conductor 202 is a tungsten plug. In embodiments, the interlayer conductor may include one or more adhesion layer liners surrounding one or more conductive plugs. In embodiments, a tungsten plug may be formed within a via by one or more chemical vapor depositions (CVD) of tungsten material. For example, a first portion of the tungsten plug is deposited in a via. This is followed by a recess process to form a low aspect ratio (depth divided by diameter) via above the deposited first portion. A second portion of the tungsten plug is then deposited into the low aspect ratio via. Forming plugs in vias with high aspect ratios, for example higher than 1.5, may result in a void formed in the deposited plug. A void in a conductive plug is also referred to as a "seam", and the problems associated with voids are referred to as "the seam issue". Therefore, because the second portion of the tungsten plug is formed in a low aspect hole there is a reduced likelihood of a void forming in the plug. This technology is therefore considered to be "seam-free" because the conductive plugs are free of voids. This process of forming a seam-free plug results in resistive oxide memory cells with higher initial resistances than cells manufactured without this process, as shown in FIG. 6. Specifically, FIG. 6 shows the comparison of initial resistance distributions of RRAM manufactured using different processes. With seam-free engineering, the initial resistance can be elevated from a few tens of KOhm to several hundreds of KOhm. Seam-free engineering along with the roughness tuning technology, also referred to as surface smoothing engineering (SSE), disclosed herein results in an even tighter initial resistance distribution. Alternatively, the plug may be formed with a single CVD deposition process. After a CVD deposition process, the resulting top surface of the interlayer conductor 202 may be rough due to grain growth in the CVD process, as shown in FIG. 3A.

Figure 3B:
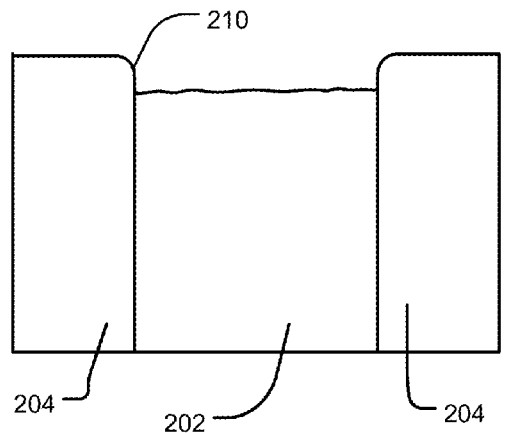

Next, a planarization step, such as a CMP process is performed, resulting in the structure shown in FIG. 3B. As shown, the resulting structure includes the top surface of the interlayer conductor 202 being recessed below the top surface of the dielectric insulator layer 204. The depth of this recess may be 100A to 800A. The resulting surface roughness of the top surface interlayer conductor 202 after the CMP process may 5-10 nm due to the grains formed in the CVD process. Further as shown, the top corner 210 of the via in the insulating dielectric layer may be rounded during the CMP process resulting in a convex corner surface. The recessed interlayer conductor 202 and convex surfaces of the top corner 210 of the insulating dielectric layer are visible in FIG. 4A, which is a TEM image corresponding to FIG. 3B.

Figure 4A:
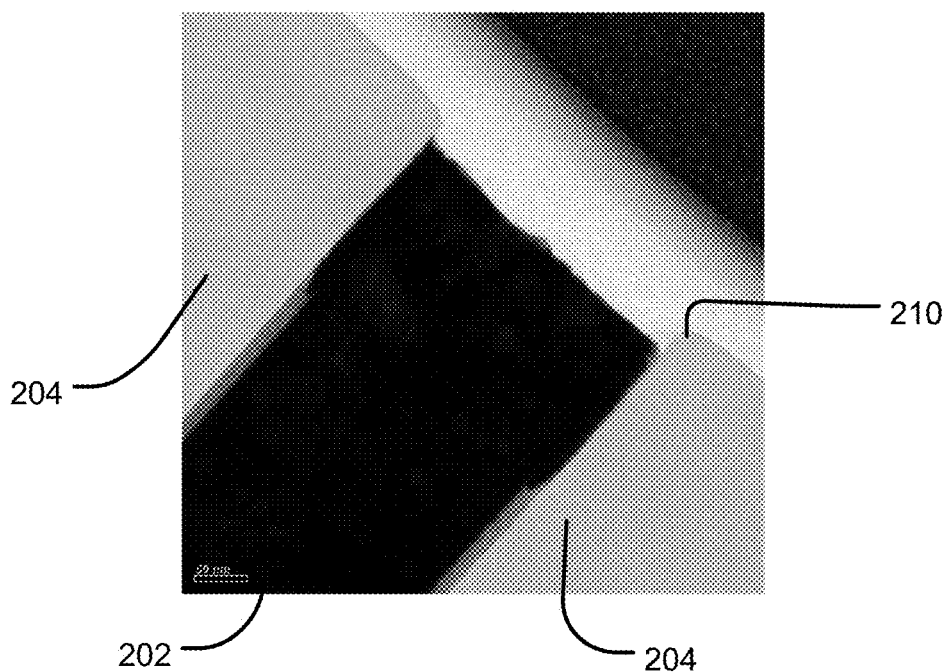
FIG. 4A is a TEM image corresponding to FIG. 3B.

The rough surface shown in FIGS. 3B and 4A is undesirable because the rough interface between the electrode surface of the interlayer conductor and the memory element may result in the spacing between the top and bottom electrodes through the metal oxide memory element, i.e the thickness of the metal oxide layer, to vary within a cell, as well as from cell to cell. The varying spacing can result in a non-uniform electrical field occurring during device operation that may affect device reliability. Therefore, it is desirable to perform a process to form a top electrode surface of the interlayer conductor with a low surface roughness. This process may create not only an interface between the interlayer conductor and the memory element with a low surface roughness, but may also create a top surface of the memory element with a low surface roughness.

Figure 3C:
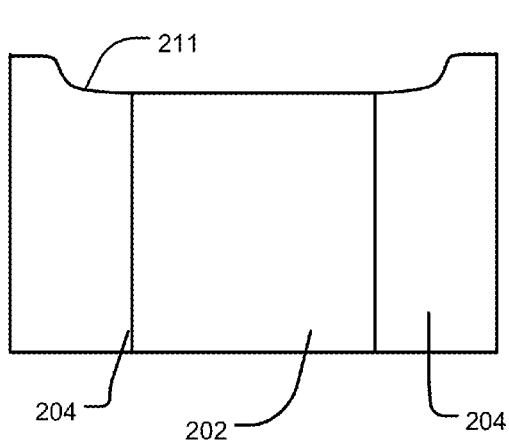
Figure 3D:
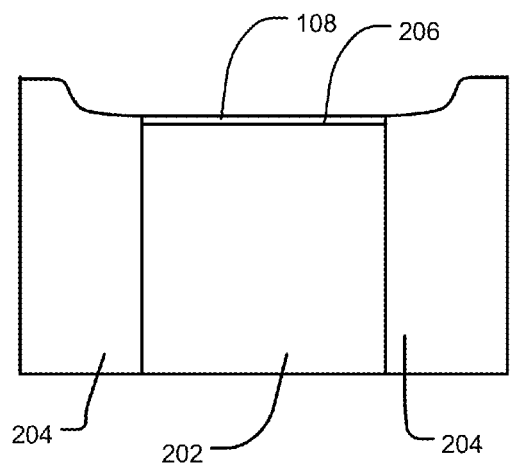

To form a flattened electrode surface on the top of the interlayer conductor 202 an ion bombardment step is performed after the CMP process, resulting in the structure shown in FIG. 3C. As shown, the ion bombardment flattens the top surface of the interlayer conductor 202 and also removes a portion of the insulating dielectric layer 204. The removed portion of the insulating dielectric layer 204 forms an indentation around the top surface of the interlayer conductor 202. As shown, the indentation includes a bottom portion that is recessed below the top surface of the insulating dielectric layer 204 to substantially the same depth as the top electrode surface of the interlayer conductor 202. The indentation of the top surface of the insulating dielectric layer 204 further includes concave sidewall portions 211 extending from the bottom portion of the indentation.

The plasma used in the ion bombardment process may be a single or a combination of gases. For example, the gas may include argon, nitrogen, or oxygen. In embodiments, the plasma may be selected to have selective etching characteristics, for example the plasma may selectively etch the metal of the interlayer conductor.

The total amount of bombardment energy delivered to the target top surface of the interlayer conductor and the initial roughness of to the target top surface of the interlayer conductor after the CMP process are the primary determining factors of the resulting surface roughness of the finished electrode surface of the interlayer conductor and therefore the uniformness of the interface between the memory element and interlayer conductor. The amount of bombardment energy is dependent on the amount and type of bombardment plasmas, bias, power and duration of the bombardment step or steps.

Figure 7:
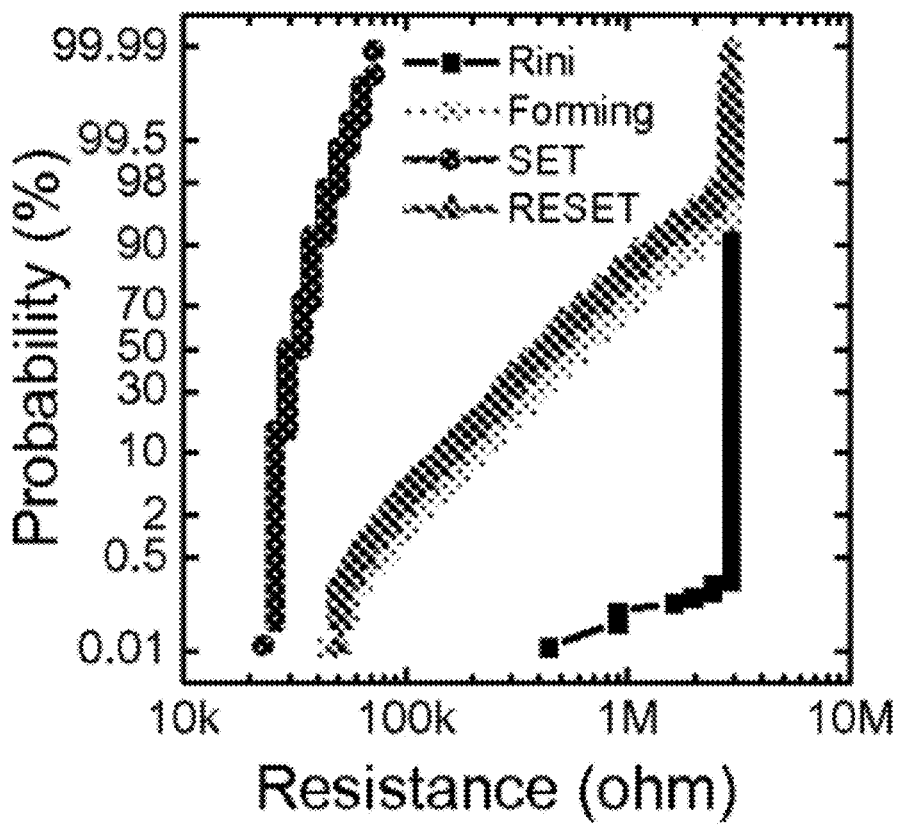
FIG. 7 is a graph showing electrical characteristics of a 1 Mb WOx RRAM ADM.
Figure 8:
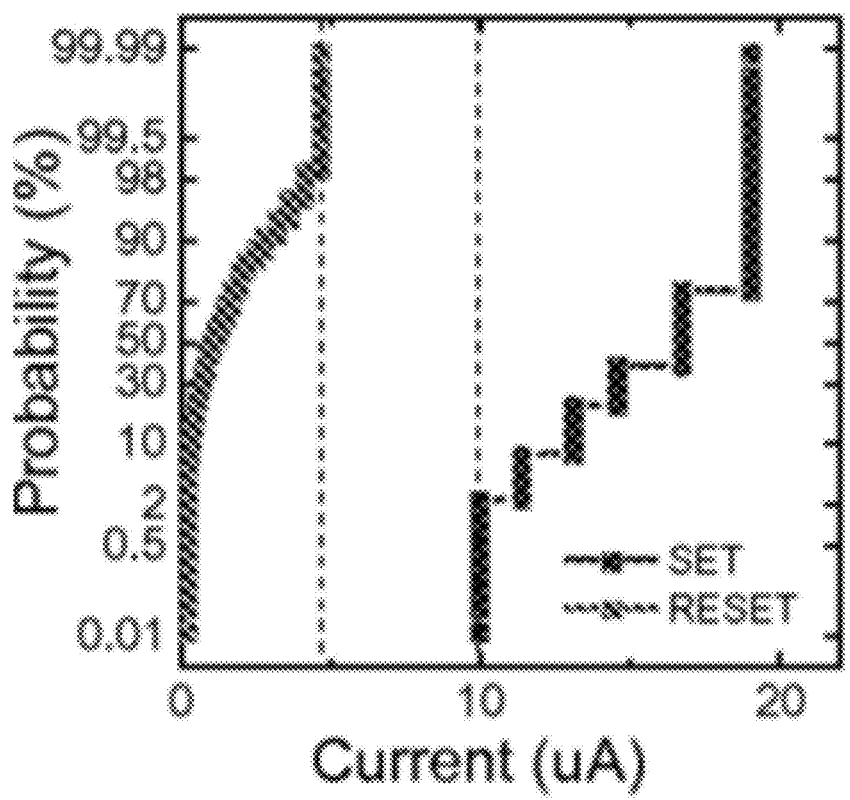
FIG. 8 is a graph showing the read window for 1 Mb ADM obtained by an optimized verify algorithm.
Figure 9:
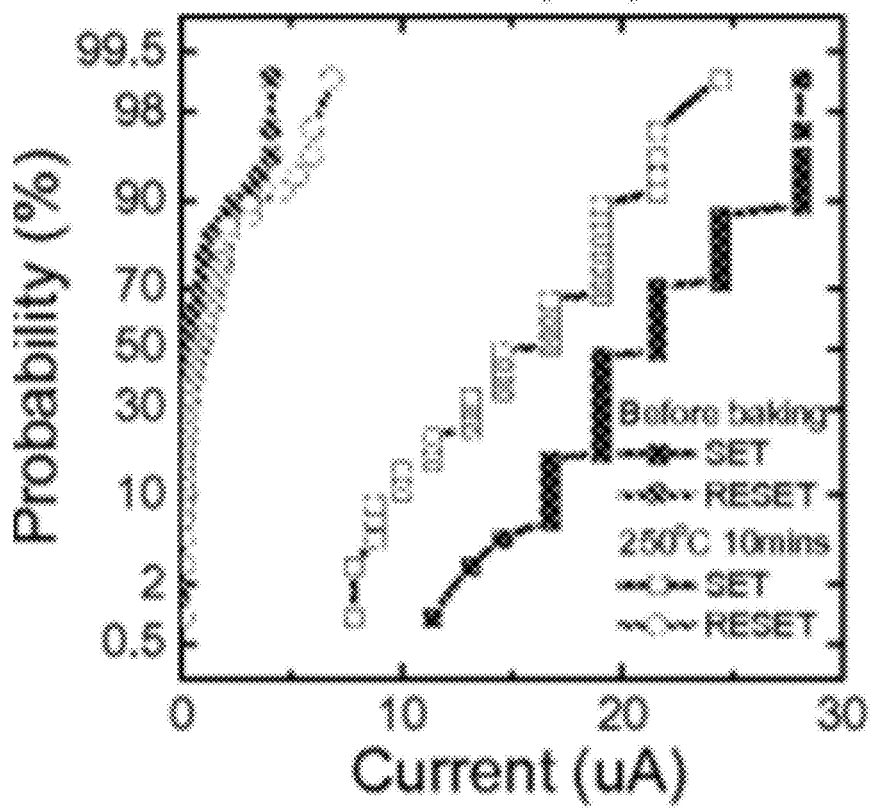
FIG. 9 is a graph showing retention of the 1 Mb WOx RRAM ADM at 250° C. for 10 mins.
Figure 10:
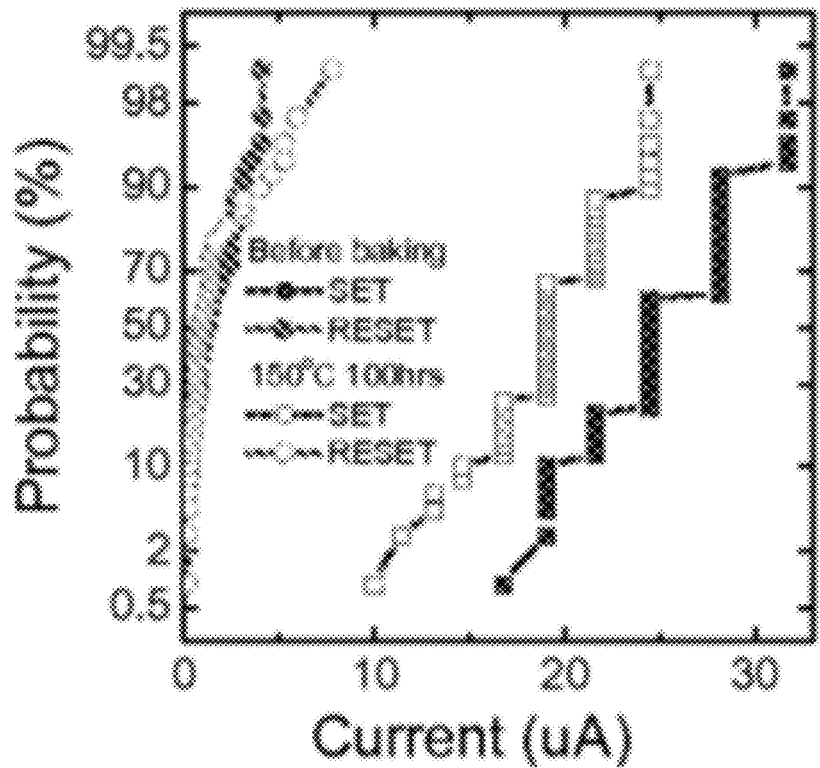
FIG. 10 is a graph showing retention of the 1 Mb WOx RRAM ADM at 150° C. for 100 hrs.
Figure 11:
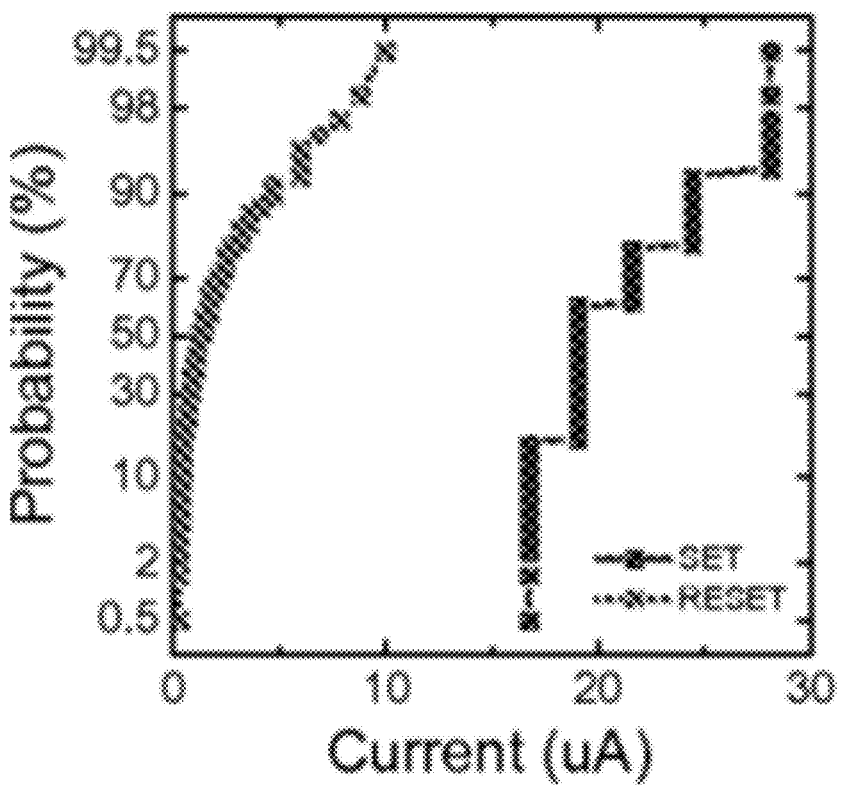
FIG. 11 is a graph showing a cumulative probability plot of cell read current after 100 cycles.

Benefits of the flattened electrode surface of the interlayer conductor after the ion bombardment process include a more uniform enhanced electrical field and more uniform resistance distribution between cells in an array, as shown in FIG. 7. For example, in a 1 Mb WOx RRAM array diagnostic module, with memory cells manufactured with the roughness tuning (also referred to as surface smoothing engineering "SSE") and seamless tungsten plug technologies, all the devices can be successfully formed and switched with corresponding SET and RESET operation conditions at 2.5/500 ns and −2.5v/500 ns, respectively. Further, the median SET and RESET resistance ratio may be over 12. Further, a SET/RESET operation algorithm with verify scheme is developed and a large read window may be obtained, as shown in FIG. 8. Specifically, in FIG. 8, a 5 uA read current window of Set/Reset sate for 1 Mb WOx RRAM is obtained by an optimized operating algorithm. Data retention performance at 250° C. for 10 minutes and 150° C. for 100 hours are shown in FIGS. 9 and 10, respectively. There is no noticeable device degradation and the read window is well maintained after high temp baking The 250° C. tolerance is especially beneficial since this allows pre-programmed coding before PCB solder bonding that is widely practiced. FIG. 11 shows a cumulative probability plot of cycling endurance test showing that a WOx RRAM ADM can 100% pass at least 100-times.

In embodiments it is desirable to have a surface roughness, $R_A$, of the top electrode surface less than 3 nm in RMS (root mean square), after the ion bombardment process and prior to the formation of the metal oxide layer, in order to promote a uniform electrical field during operation. However, smaller surface roughnesses are attainable using this roughness tuning technology, with a limitation around 1 atomic layer. The surface roughness of the top electrode surface after plasma oxidation is used to oxidize the metal surface remains the same since plasma oxidation isanisotropic. The surface roughness, $R_A$, is a value determined by analyzing a cross-section of the interlayer conductor by TEM or observed using atomic force microscopy. The top portion of the cross-section corresponds to the profile of the top electrode surface. Through a fitting algorithm an equation is calculated which most closely fits the top portion of the cross-section. This equation defining the fitted line segment may be any equation including a straight line, an arc or a parabola. The roughness is then calculated as the average deviation from the fitted line of the actual top profile portion of the cross-section in the direction normal to the fitted line.

Next a metal oxide layer may be formed to create the memory element 108. In the embodiment shown, an oxidation step is performed wherein the top portion of the interlayer conductor 202 is oxidized to form a metal oxide memory element 108, resulting in the structure shown in FIG. 3D. For example, a plasma oxidation process may be performed wherein the top portion of the interlayer conductor is exposed to 500 sccm of oxygen at 120 volts bias, 500 W RF power, and 30 millitorr working pressure in a RIE (reactive ion etcher). The metal oxide layer formed by plasma oxidation may be 3 nm in thickness. Forming the metal oxide memory element 108 on the interlayer conductor 202 in this way has the advantage of creating a self-aligned layer of metal oxide on the interlayer conductor. In embodiments, the metal oxide layer may be formed through other types of oxidation process, for example thermal oxidation, and photo-oxidation WOx. Additionally, the metal oxide layer may be formed through an oxide deposition process.

Figure 4B:
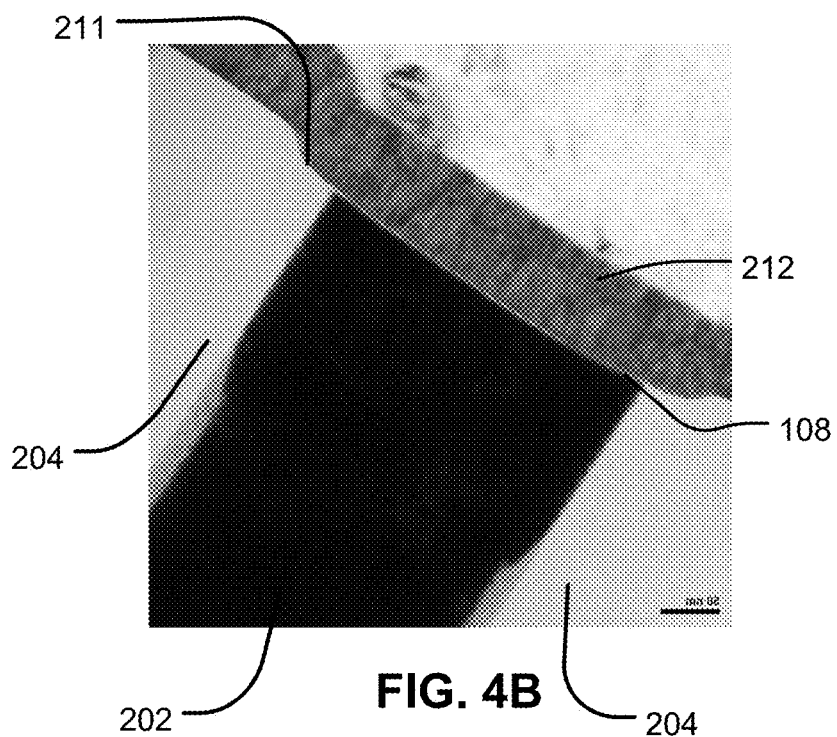
FIG. 4B is a TEM image corresponding to FIG. 3D.
Figure 5:
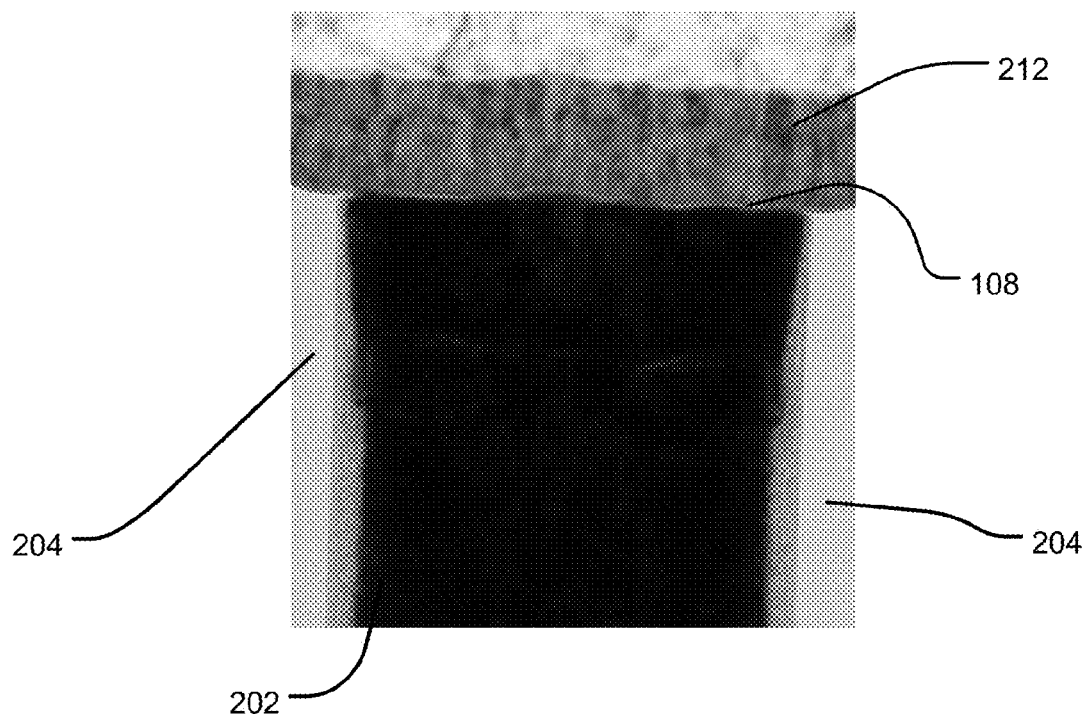
FIG. 5 is a TEM image showing a memory cell without roughness tuning

After the memory element 108 is formed, a top electrode 212 may be formed on top of the memory element 108, resulting in the structure shown in FIG. 2. The top electrode may be an access line or may be a conductor electrically connecting the memory element 108 to an access line or access device. In embodiments, the top electrode may be formed by depositing layer of conductive material on top of the insulating dielectric layer 204 and the memory element 108 and patterning the deposited layer to form an access line. The top electrode 212 formed within the convex surfaces of the top corner 210 of the insulating dielectric layer are visible in FIG. 4B, which is a TEM image corresponding to FIG. 2. FIG. 5 shows a TEM image of a memory device similar to the memory device shown in FIG. 4B wherein an ion bombardment process was not performed on the top electrode surface of the interlayer conductor prior to the memory element 108 being formed. The resulting memory element 108 has rough interfaces with the interlayer conductor 202 and the top electrode 212

Figure 1B:
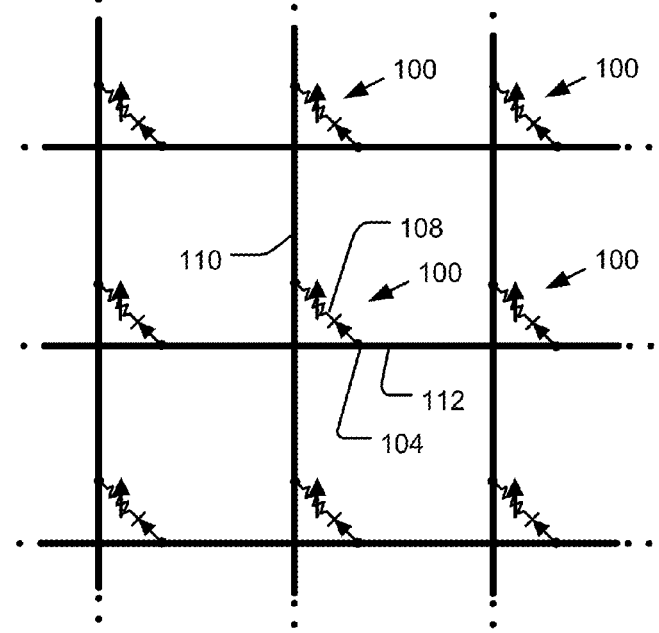
FIG. 1B is a schematic of a cross-point memory cell array in accordance with an embodiment.
Figure 12:
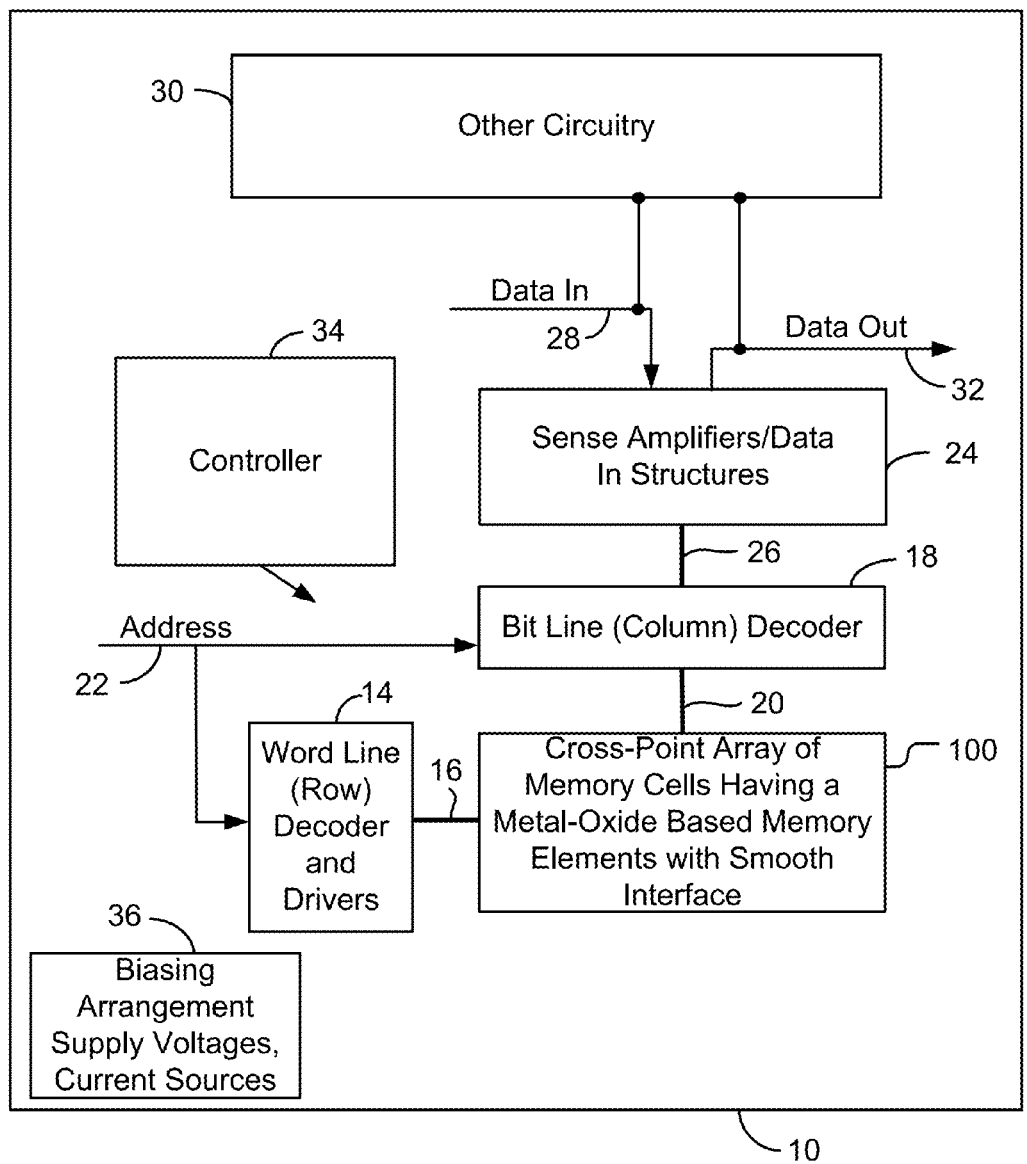
FIG. 12 is a simplified block diagram of an integrated circuit array in accordance with an embodiment.

FIG. 12 is a simplified block diagram of an integrated circuit 10 including a cross-point memory array of memory cells, such as is shown in FIG. 1B, having a metal-oxide based memory. A word line decoder 14 is coupled to and in electrical communication with a plurality of word lines 16. A bit line (column) decoder 18 is in electrical communication with a plurality of bit lines 20 to read data from, and write data to, the memory cells (not shown) in a array. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 100. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

It will be understood that the memory array is not limited to the array configuration illustrated in FIG. 1B and additional array configurations can also be used with memory cells including the memory element disclosed above.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory cell, comprising:
   an insulation layer having an upper surface and an indentation in the upper surface;
   an interlayer conductor in a via extending through the insulation layer in the indentation, wherein a first end of the interlayer conductor is located proximal to a bottom surface of the insulation layer and the second end of the interlayer conductor located distal to the bottom surface comprises an electrode surface recessed below the upper surface of the insulation layer;
   a memory element in electrical contact with the electrode surface; and
   a conductor over and in contact with the memory element within the indentation;
   wherein the electrode surface has a surface roughness RA less than 3nm, and the indentation includes a concave sidewall portion above the electrode surface extending outwardly from the interlayer conductor toward the upper surface.

2. The memory cell of claim 1, wherein the first end of the interlayer conductor is coupled to a terminal of an access device.

3. An integrated circuit comprising:
   an insulation layer having an upper surface and indentations in the upper surface;
   an array of memory cells, a memory cell in the array comprising;
      an interlayer conductor in a via extending through the insulation layer in a corresponding indentation in the upper surface of the insulation layer; wherein a first end of the interlayer conductor is located proximal to a bottom surface of the insulation layer and the second end of the interlayer conductor located distal to the bottom surface comprises an electrode surface recessed below the upper surface of the insulation layer;
      a memory element electrically coupled to the electrode surface; and
      a conductor over and in contact with the memory element within the indentation;
      wherein the electrode surface has a surface roughness RA less than 3nm;
      wherein the indentation includes a concave sidewall portion above the electrode surface extending outwardly from the interlayer conductor toward the upper surface;
      and
      wherein the electrode surface is recessed below the top surface of the insulation layer; and
   control circuitry to control application of bias arrangement supply voltages.

4. The memory cell of claim 1, wherein the second end of the interlayer conductor is a smoothed surface smoothed by an ion bombardment process.

5. The memory cell of claim 1, wherein the electrode surface is a flattened top surface of the interlayer conductor.

6. The memory cell of claim 1, wherein the memory element is an oxide formed by a rapid thermal oxidation process of the interlayer conductor.

7. The memory cell of claim 1, wherein the memory element essentially consists of oxides of a metal material of the interlayer conductor.

8. The memory cell of claim 1, the memory element is characterized by having a programmable resistance.

9. The integrated circuit of claim 3, wherein the electrode surface is a smoothed surface smoothed by an ion bombardment process.

10. The integrated circuit of claim 3, wherein the electrode surface is a flattened top surface of the interlayer conductor.

11. The integrated circuit of claim 3, wherein the memory element is an oxide formed by a rapid thermal oxidation process of the interlayer conductor.

12. The integrated circuit of claim 3, wherein the memory element essentially consists of oxides of a metal material of the interlayer conductor.

13. The integrated circuit of claim 3, the memory element is characterized by having a programmable resistance.

14. The integrated circuit of claim 3, including an access device, and wherein the first end of the interlayer conductor is coupled to a terminal of the access device.

\* \* \* \* \*